United States Patent [19]

Russo et al.

[11] Patent Number: 5,102,691
[45] Date of Patent: Apr. 7, 1992

[54] METHOD OF PRETREATMENT FOR THE HIGH-DEPOSITION-RATE PRODUCTION OF FLUORINE-DOPED TIN-OXIDE COATINGS HAVING REDUCED BULK RESISTIVITIES AND EMISSIVITIES

[75] Inventors: David A. Russo, Edison; Ryan Dirkx, Belle Mead; Jerome L. Buchanan, Raritan Township, Hunterdon County, all of N.J.

[73] Assignee: Atochem North America, Inc., Philadelphia, Pa.

[21] Appl. No.: 410,178

[22] Filed: Sep. 20, 1989

[51] Int. Cl.$^5$ .................. C23C 16/02; C23C 16/40
[52] U.S. Cl. .................................. 427/109; 427/166; 427/255.2; 427/255.3; 427/309; 427/315; 65/60.5; 65/60.52

[58] Field of Search ............ 427/108, 109, 110, 255.2, 427/255.3, 255.7, 299, 402, 314, 309, 315, 166; 65/30.12, 60.1, 60.5, 60.51, 60.52

[56] References Cited

U.S. PATENT DOCUMENTS

| | | | |
|---|---|---|---|
| 3,065,103 | 11/1962 | Marzocchi | 427/315 |
| 4,261,722 | 4/1981 | Novak et al. | 427/315 |
| 4,293,326 | 10/1981 | Terneu et al. | 427/166 |

*Primary Examiner*—Shrive Beck
*Assistant Examiner*—Margaret Burke
*Attorney, Agent, or Firm*—Stanley A. Marcus; Robert B. Henn

[57] ABSTRACT

A method for producing coatings on a heated substrate, preferably glass, comprises pretreating the substrate with a gaseous composition of water, air and a fluorine compound, and thereafter depositing a fluorine-doped tin-oxide coating on the substrate.

5 Claims, No Drawings

METHOD OF PRETREATMENT FOR THE HIGH-DEPOSITION-RATE PRODUCTION OF FLUORINE-DOPED TIN-OXIDE COATINGS HAVING REDUCED BULK RESISTIVITIES AND EMISSIVITIES

BACKGROUND OF THE INVENTION

1. Field of the Invention

This invention is in the field of fluorine-doped tin-oxide coatings on glass; more particularly, the present invention is in the field of pretreating methods for gaseous treatment of substrates for the production of uniform coatings at a high deposition rate, wherein the treated substrate has a reduced bulk resistivity and emissivity.

2. Description of the Prior Art

Brown, in U.S. Pat. No. 4,721,632, describes a method for improving the conductivity and lowering the emissivity of a fluorine-doped tin-oxide film on a glass sheet. The method disclosed involves pretreating the hot glass with a spray solution of ammonium fluoride in either water or a mixture of methanol and water. Spray pretreatment of other fluorine compounds in a suitable solvent is also mentioned. However, spraying hot glass with these solutions results in excessive cooling of the glass, which reduces the deposition rate and can reduce the conductivity of the fluorine-doped tin-oxide coatings. Furthermore, uneven cooling of continuous glass ribbons prevents the tin-oxide coatings from covering the entire glass surface in a uniform fashion.

Accordingly, an object of the present invention is to provide a method and composition for increasing the deposition rate of fluorine-doped tin-oxide coatings on glass substrates.

Another object herein is to provide fluorine-doped tin-oxide coatings which exhibit low bulk resistivities and emissivities.

SUMMARY OF THE INVENTION

The present invention is a method for producing coatings on a heated substrate comprising pretreating the substrate with a gaseous treating composition comprising water and a treating gas, and thereafter depositing a fluorine-doped tin-oxide coating on the substrate. In a preferred embodiment, the pretreatment method comprises contacting a heated glass substrate with a composition consisting essentially of water, a fluorine-containing material and air.

DESCRIPTION OF THE PREFERRED EMBODIMENTS

In accordance with the invention, a heated substrate is pre-treated with a reactive gaseous composition; thereafter, a fluorine-doped tin oxide coating is deposited on the substrate.

In a preferred form of the invention, a gaseous treating composition is provided which includes water, a fluorine-containing compound, and a gas. The water and the fluorine-containing compound can be mixed together and added to the hot gas stream to form the gaseous treating composition, or they can be added separately in the pretreatment of a continuous glass substrate.

The fluorine-containing compounds include, but are not limited to, fluorinated carboxylic acids or anhydrides such as, e.g., trifluoroacetic acid, trifluoroacetic anhydride, perfluoropropionic acid, difluoroacetic acid and fluoroacetic acid; inorganic fluorine-containing compounds such as HF and $NF_3$, and fluorocarbon compounds such as $CF_3Br$, $CF_3H$, $CHClF_2$ and $CF_3Cl$.

The gases include but are not limited to air, oxygen, nitrogen, hydrogen, $N_2O$, $CO_2$, argon, and mixtures thereof. The substrate can be soda-lime glass, borosilicate glass, fused silica and the like, as well as thin films of $SiO_2$.

The film properties of the deposited doped tin-oxide film are greatly enhanced as a result of the gaseous pretreatment. The deposition rate is increased three- to fourfold over untreated glass, and bulk resistivity and emissivity are reduced by about 20 to 25%.

While not wishing to be bound by any theory as to the operation of the method of the present intention, it is believed that the water vapor causes the glass surface to be saturated with Si-OH groups, thereby making that surface more reactive for subsequent coating reactions. There is also some indication that the water vapor aids in dealkalization of the surface. When a fluorine-containing compound is present in the vapor, the glass surface is further activated by reaction of fluoride ion or HF with the surface —SiOH groups. Those skilled in the art will recognize that the effect of various fluorine compounds will vary, depending upon factors such as molecular weight, kind of bonding, and the number and nature of other substituents in the molecule. The method further has utility on substrates which have been precoated with silica. Suitable and preferred ranges of pretreatment gaseous compositions include the following:

| 1) | Water/Gas (mol %) | |
|---|---|---|
| | 0.1–45/55–99.9 | Suitable |
| | 20–30/70–80 | Preferred |
| 2) | Water/Fluorine Compound/Gas (mol %) | |
| | 0.1–30/0.025–5/65–99.9 | Suitable |
| | No $SiO_2$ pre-coat | Preferred |
| | 15–25/0.1–0.3/74.7–84.9 | |
| | $SiO_2$ pre-coat | Preferred |
| | 0.5–1.0/0.1–0.2/98.8–99.4 | |

The following examples are illustrative, but not in limitation, of this invention.

EXAMPLE I

A soda-lime-silica glass sheet was heated to 600° C. and treated with a gaseous mixture of water and air at 150° C. The sheet was overcoated with 200 nanometers (nm) of fluorine-doped tin oxide (TOF) by the method set forth in U.S. Pat. No. 4,601,917, assigned to the same assignee as the present invention. The effects on the bulk resistivity, deposition rate and emissivity are shown in Table I.

TABLE I

| EFFECT OF $H_2O$/AIR PRETREATMENT ON TOF FILM PROPERTIES | | | |
|---|---|---|---|
| Pretreatment Gaseous Composition, $H_2O$/Air (mol %) | Bulk Resistivity × $10^{-4}$ ohm-cm | Dep. Rate, Å/sec | $\epsilon_h^*$, calc. |
| 26/74 | 6.4 ± 0.2 | 350 | 0.31 |
| 0.3/99.7 | 6.2 ± 0.5 | 120 | 0.31 |
| 0/100 | 7.2 ± 0.2 | 90 | 0.35 |

*Calculated from specular-reflectance measurement.

The results show a fourfold increase in deposition rate and a significant reduction in bulk resistivity and emissivity over films prepared without the pretreatment of the invention.

EXAMPLE II

A soda-lime-silica glass sheet was heated to 600° C. and treated with a gaseous mixture of water, trifluoroacetic acid (TFA) and air at 150° C. The sheet was overcoated with a TOF film according to Example I. The effects of the pretreatment on film properties are shown in Table II.

TABLE II
EFFECTS OF $H_2O$/TFA/AIR PRETREATMENT ON TOF FILM PROPERTIES

| Pretreatment Gaseous Composition, $H_2O$/TFA/Air (mol %) | Bulk Resistivity × $10^{-4}$ ohm-cm | Dep. Rate, Å/sec | $\epsilon_h$, calc. |
|---|---|---|---|
| 24.8/0.20/75.0 | 5.3 ± 0.1 | 340 | 0.28 |
| 15.9/0.13/84.0 | 5.4 ± 0.1 | 340 | 0.29 |
| 0.26/0.04/99.7 | 6.5 ± 0.2 | 125 | 0.31 |
| 0/0/100 | 7.2 ± 0.2 | 90 | 0.35 |

The results show a fourfold increase in deposition rate, and a greater decrease in bulk resistivity and emissivity than the films of Example I.

EXAMPLE III

Borosilicate-glass sheets were heated to about 590° C. under 10 torr pressure and treated with a gaseous mixture of water, hydrogen fluoride and nitrogen. The sheets were overcoated with about 200 nm of fluorine-doped tin oxide from a gaseous mixture of stannic chloride and hydrogen fluoride. The effects of the pretreatment on film properties are shown in Table III.

TABLE III
EFFECTS OF $H_2O$/HF/$N_2$ PRETREATMENT ON TOF FILM PROPERTIES

| Pretreatment Gaseous Composition, $H_2O$/HF/Air (mol %) | Bulk Resistivity × $10^{-4}$ ohm-cm | Dep. Rate, Å/sec | $\epsilon_h$, calc. |
|---|---|---|---|
| 0.64/0.14/99.22 | 4.1 | 105 | 0.23 |
| 0.64/0.14/99.22 | 4.2 | 110 | 0.23 |
| 0/0/100 | 4.7 | 40 | 0.27 |

The results show a threefold increase in deposition rate, and significant reductions in bulk resistivity and emissivity over untreated glass.

EXAMPLE IV

A soda-lime-silica glass sheet was heated to 600° C. and treated with a gaseous mixture of water and hydrofluoric acid at a temperature of 150° C., and immediately overcoated with 200 nm of fluorine-doped tin oxide according to the method of U.S. Pat. No. 4,601,917. The effects of the gaseous pretreatment on film properties are shown in the following table:

TABLE IV
EFFECT OF $H_2O$/HF/AIR PRETREATMENT ON TOF FILM PROPERTIES

| Pretreatment Gaseous Composition, $H_2O$/HF/Air (mol %) | Bulk Resistivity × $10^{-4}$ ohm-cm | Dep. Rate, Å/sec | $\epsilon_h$, (calc.) |
|---|---|---|---|
| 0.16/0.14/99.7 | 6.2 ± 0.6 | 181 | 0.32 |
| 0/0/100 | 7.6 ± 0.3 | 144 | 0.37 |

The results show that a substantial decrease in bulk resistivity and emissivity is obtained.

EXAMPLE V

A soda-lime-silica glass sheet was heated to 600° C. and treated with a gaseous mixture of trifluoroacetic acid and air. The treated sheet was immediately overcoated with 200 nm of fluorine-doped tin oxide according to Example 1. The effects on film properties are shown in the following table:

TABLE V
EFFECT OF TFA/AIR PRETREATMENT ON TOF FILM PROPERTIES

| Pretreatment Gaseous Composition, TFA/Air (mol %) | Bulk Resistivity × $10^{-4}$ ohm-cm | Dep. Rate, Å/sec | $\epsilon_h$, (calc.) |
|---|---|---|---|
| 0.5/99.5 | 8.4 ± 1.6 | 210 | 0.25 |
| 0/100 | 7.6 ± 0.3 | 140 | 0.27 |

The results from Table V show that TFA pretreatment increases deposition rate by less than a factor of two, and has no effect on the bulk resistivity. It appears that the absence of water in the pretreatment gaseous mixture essentially prevents the enhancement of the bulk resistivity.

In summary, the invention herein provides a novel process for increasing the deposition rate of a fluorine-doped tin oxide coating on glass while reducing bulk resistivity and emissivity, and producing a coating which uniformly covers the entire surface of the glass substrate.

Modifications, changes and improvements to the preferred forms of the invention herein described, disclosed and illustrated may occur to those skilled in the art who come to understand the principles and precepts thereof. Accordingly, the scope of the patent to be issued hereon should not be limited to the particular embodiments of the invention set forth herein, but rather should be limited only by the advance by which the invention has promoted the art.

What is claimed is:

1. The method of increasing the deposition rate of a fluorine-doped tin-oxide coating with reduced emissivity on a heated flat-glass substrate which comprises pretreating the substrate with a gaseous treating composition comprising at least 0.1 mol % water, a compound selected from the group consisting of fluorinated carboxylic acids and fluorinated carboxylic anhydrides, and a gas.

2. The method according to claim 1, wherein the gaseous treating composition comprises from about 0.1 to about 30 mol % water, from about 0.025 to about 5 mol % of the fluorine compound, and from about 65 to about 99.9 mol % air.

3. The method according to claim 1 wherein the gas is selected from the group consisting of air, oxygen, nitrogen, hydrogen, $N_2O$, $CO_2$, argon, and mixtures thereof.

4. The method according to claim 1 wherein the gaseous treating composition comprises from about 15 to about 25 mol % water, from about 0.1 to about 0.3 mol % trifluoroacetic acid, and from about 75 to about 85 mol % gas.

5. The method according to claim 1 wherein the composition comprises from about 0.6 to about 0.7 mol % water, from about 0.1 to about 0.2 mol % fluorine compound, and from about 99.1 to about 99.3 mol % gas.

* * * * *